(12) United States Patent
Lu et al.

(10) Patent No.: US 9,291,674 B1
(45) Date of Patent: Mar. 22, 2016

(54) INTEGRATED CIRCUIT WITH LOW POWER SCAN FLIP-FLOP

(71) Applicants: Sian Lu, Tianjin (CN); Hao Wang, Tianjin (CN)

(72) Inventors: Sian Lu, Tianjin (CN); Hao Wang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/580,237

(22) Filed: Dec. 23, 2014

(30) Foreign Application Priority Data

Sep. 29, 2014   (CN) .......................... 2014 1 0711767

(51) Int. Cl.
*G01R 31/28* (2006.01)
*G01R 31/3177* (2006.01)
*G01R 31/3185* (2006.01)
*H03K 3/012* (2006.01)

(52) U.S. Cl.
CPC .... *G01R 31/3177* (2013.01); *G01R 31/318541* (2013.01); *G01R 31/318594* (2013.01); *H03K 3/012* (2013.01)

(58) Field of Classification Search
CPC .................. G01R 31/3177; G01R 31/318525; G01R 31/318541; G01R 31/318594; H03K 3/012; H03K 3/037; H03K 3/356
See application file for complete search history.

(56) References Cited

U.S. PATENT DOCUMENTS

| | | | |
|---|---|---|---|
| 5,498,988 A | 3/1996 | Reyes et al. | |
| 7,038,494 B2 * | 5/2006 | Morton | G01R 31/318541 326/93 |
| 7,418,640 B2 | 8/2008 | Kapur et al. | |
| 7,457,998 B1 * | 11/2008 | Bhatia | G01R 31/318541 714/724 |
| 7,631,209 B2 | 12/2009 | Schultz | |
| 7,702,980 B2 | 4/2010 | Chen | |
| 7,747,917 B2 * | 6/2010 | Putman | G01R 31/318541 327/202 |
| 7,772,906 B2 | 8/2010 | Naffziger | |
| 7,808,279 B2 | 10/2010 | Srivastava et al. | |
| 8,332,698 B2 * | 12/2012 | Tang | G01R 31/318552 714/726 |
| 8,484,523 B2 * | 7/2013 | Ramaraju | G06F 11/267 714/731 |
| 2006/0095819 A1 * | 5/2006 | Bhatia | G01R 31/318541 714/726 |

* cited by examiner

*Primary Examiner* — Patrick O'Neill
(74) *Attorney, Agent, or Firm* — Charles E. Bergere (57) ABSTRACT

A scan-testable integrated circuit includes first and second flip-flops. The first flip-flop includes first and second latches and the second flip-flop includes third and fourth latches and a logic circuit. During scan-shift mode of scan testing, the first flip-flop shifts a first bit of a test pattern into the second flip-flop. The first flip-flop then shifts a second bit of the test pattern into the second flip-flop. The logic circuit deactivates a clock signal provided to the third latch, which is a master latch, when the logic states of the first and second bits are equal. The output terminals of the third and fourth latches are retained at the logic state corresponding to the first bit, thereby reducing power consumption.

20 Claims, 7 Drawing Sheets

INTEGRATED CIRCUIT WITH LOW POWER SCAN FLIP-FLOP

BACKGROUND OF THE INVENTION

The present invention generally relates to integrated circuits, and, more particularly, to scan flip-flop circuits.

Integrated circuits (ICs) such as a system on a chip (SoC) integrate various digital as well as analog components on a single chip. Designs of SoCs may have manufacturing defects, such as short circuits, open circuits, material defects, and damaged vias. Such manufacturing defects can cause the SoC to malfunction. Therefore, it is essential to test the SoCs for manufacturing defects.

Design for testability (also referred to as design for test or DFT) are design techniques that add testability features to the ICs. DFT enables Automatic Test Equipments (ATEs) to execute various fault test methods using test patterns generated by Automatic Test Pattern Generators (ATPGs). Each test pattern includes a set of bits. The ATPG sets the logic state of the each bit based on the type of fault to be tested in the IC.

Conventionally, fault test methods are categorized into two types—functional testing and structural testing. Functional testing uses functional or operational test patterns generated by verification engineers to test the functional characteristics of an IC. However, due to technological advancements that have vastly increased the number of components on a chip, the complexity and time required for generating functional test patterns has increased, thereby increasing the time and cost of testing. Structural testing (also referred to as scan testing) models the manufacturing defects as logic faults that are detected using simple memory elements such as flip-flops (also referred to as scan flip-flops) connected to each other in a chain (i.e., a scan chain), within the IC.

Scan testing has two modes, scan-shift and scan-capture. The scan-shift mode includes shift-in and shift-out modes. When scan testing is activated, the IC is set in the scan-shift mode. In the scan-shift mode, an ATPG generates a test pattern (also referred to as a test vector $V_1$) and provides the test pattern to the ATE. The ATE shifts the test pattern, which is just a set of bits, into the scan flip-flops. Each bit of the test pattern is shifted in to the scan flip-flops based on consecutive clock pulses of a clock signal. The scan flip-flops operate as shift registers and shift the bits through the chain. At the end of the scan-shift mode, each scan flip-flop of the scan chain holds a corresponding bit of the test pattern.

When the test patterns is loaded into the IC, the IC undergoes logic state transitions based on the test patterns and a scan enable signal.

During the scan-capture mode, the scan flip-flops capture the logic state transitions of internal combinational logic of the IC based on a scan clock signal. Thus, each scan flip-flop stores a bit corresponding to the output of multiple logic modules of the IC.

After the completion of scan-capture mode, the IC is set in the scan-shift mode so that the stored bits can be shifted out of the IC (referred to as a test vector $V_2$) and compared against an expected pattern. The ATE differentiates between functional and faulty ICs by comparing the output test pattern with the expected output test pattern.

Figure 1A:
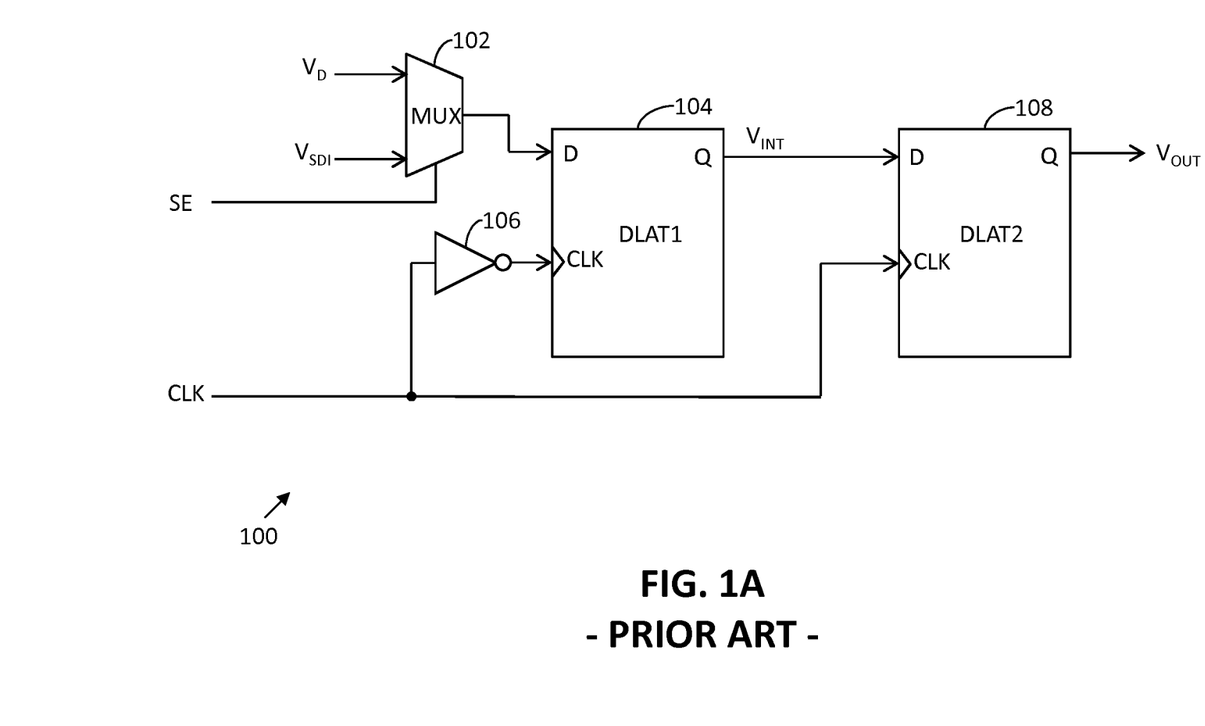
FIG. 1A is a schematic block diagram of a conventional scan flip-flop circuit.

FIG. 1A is a schematic block diagram of a conventional scan flip-flop circuit 100. The scan flip-flop circuit 100 includes a multiplexer 102, a master latch 104, a NOT gate 106 and a slave latch 108. The scan flip-flop circuit 100 has a clock input terminal (CLK) for receiving a clock signal and a scan enable input terminal (SE) for receiving a scan enable signal. The multiplexer 102 has a first input terminal for receiving a data input signal ($V_D$), a second input terminal for receiving a scan data input signal ($V_{SDI}$), a select input terminal connected to the scan enable input terminal (SE) for receiving the scan enable signal and an output terminal for outputting at least one of the data input signal ($V_D$) and the scan data input signal ($V_{SDI}$). The master latch 104 has a input terminal connected to the output terminal of the multiplexer 102 for receiving at least one of the data input signal ($V_{DI}$) and the scan data input signal ($V_{SDI}$), a clock input terminal connected to an output terminal of the NOT gate 106 for receiving an inverted clock signal, and an output terminal for outputting an intermediate output signal ($V_{INT}$). The slave latch 108 has an input terminal connected to the output terminal of the master latch 104 for receiving the intermediate output signal ($V_{INT}$), a clock input terminal for receiving the clock signal, and an output terminal for outputting an output signal ($V_{OUT}$).

Figure 1B:
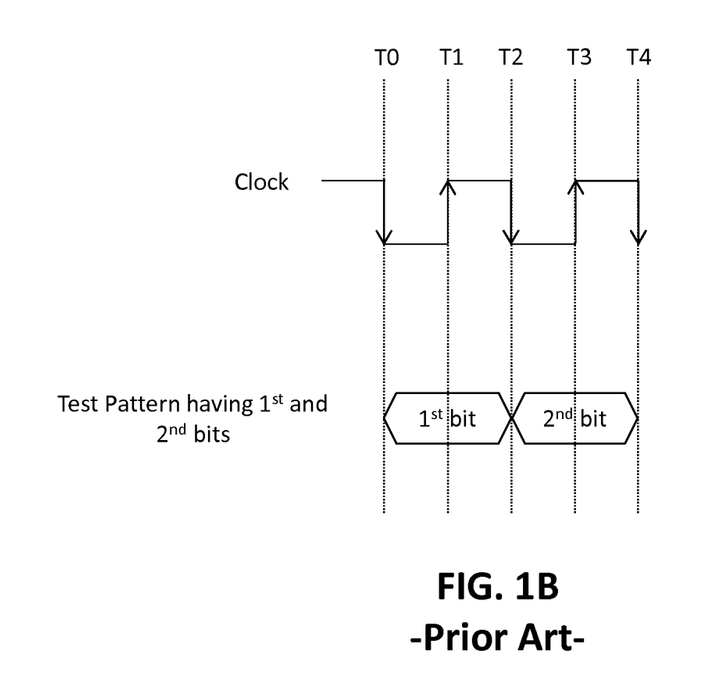
FIG. 1B is a timing diagram illustrating the scan-shift mode operation of the scan flip-flop circuit of FIG. 1A.

FIG. 1B is a timing diagram illustrating the scan-shift mode of scan testing of the scan flip-flop circuit 100. During scan testing, at time T0, the scan enable signal is at a logic high state and a first bit of the test pattern is shifted-in to the scan flip-flop circuit 100.

From T0-T1, the clock signal is at a logic low state and the multiplexer 102 outputs the first bit of the test pattern to the master latch 104. The master latch 104 receives the clock signal at a logic high state from the NOT gate 106. Thus, the master latch 104 is activated and hence, the master latch 104 outputs the intermediate output signal ($V_{INT}$) at the logic state corresponding to the first bit. The slave latch 108 receives the clock signal at a logic low state and hence, is deactivated.

From T1 to T2, the clock signal is at a logic high state. The master latch 104 receives the clock signal at a logic low state from the NOT gate 106 and hence, is deactivated. However, the slave latch 108 receives the clock signal at a logic high state. Thus, the slave latch 108 is activated, and receives the intermediate output signal ($V_{INT}$) and generates the output signal ($V_{OUT}$) at a logic state corresponding to the first bit.

Thus, from T0 to T2, the first bit of the test pattern is shifted into the scan flip-flop circuit 100. Similarly, from T2 to T4, the second bit of the test pattern is shifted into the scan flip-flop circuit 100.

However, when the test pattern includes consecutive bits having the same logic state, i.e., when the logic state of the first and second bits of the test patterns are same, the master and slave latches 104 and 108 are clocked to shift-in the first and second bits in the scan chain. Even if the logic state of the intermediate output signal ($V_{INT}$) is fixed at the logic state of the first and second bits, the clock input terminals of the master and slave latches 104 and 108 toggle based on the logic state of the clock signal. As a result, the internal components of the scan flip-flop circuit 100 (e.g., transistors and capacitors), are charged and discharged frequently, thereby leading to unnecessary power consumption. Further, due to the increase in the power consumption during scan testing, the voltage drop across the scan chain may exceed the expected voltage drop for which the scan flip-flop circuit 100 is designed, thereby reducing the voltage level of the clock signal at the clock input terminal of the scan flip-flop circuit 100 and leading to failure of the scan testing technique.

Figure 2:
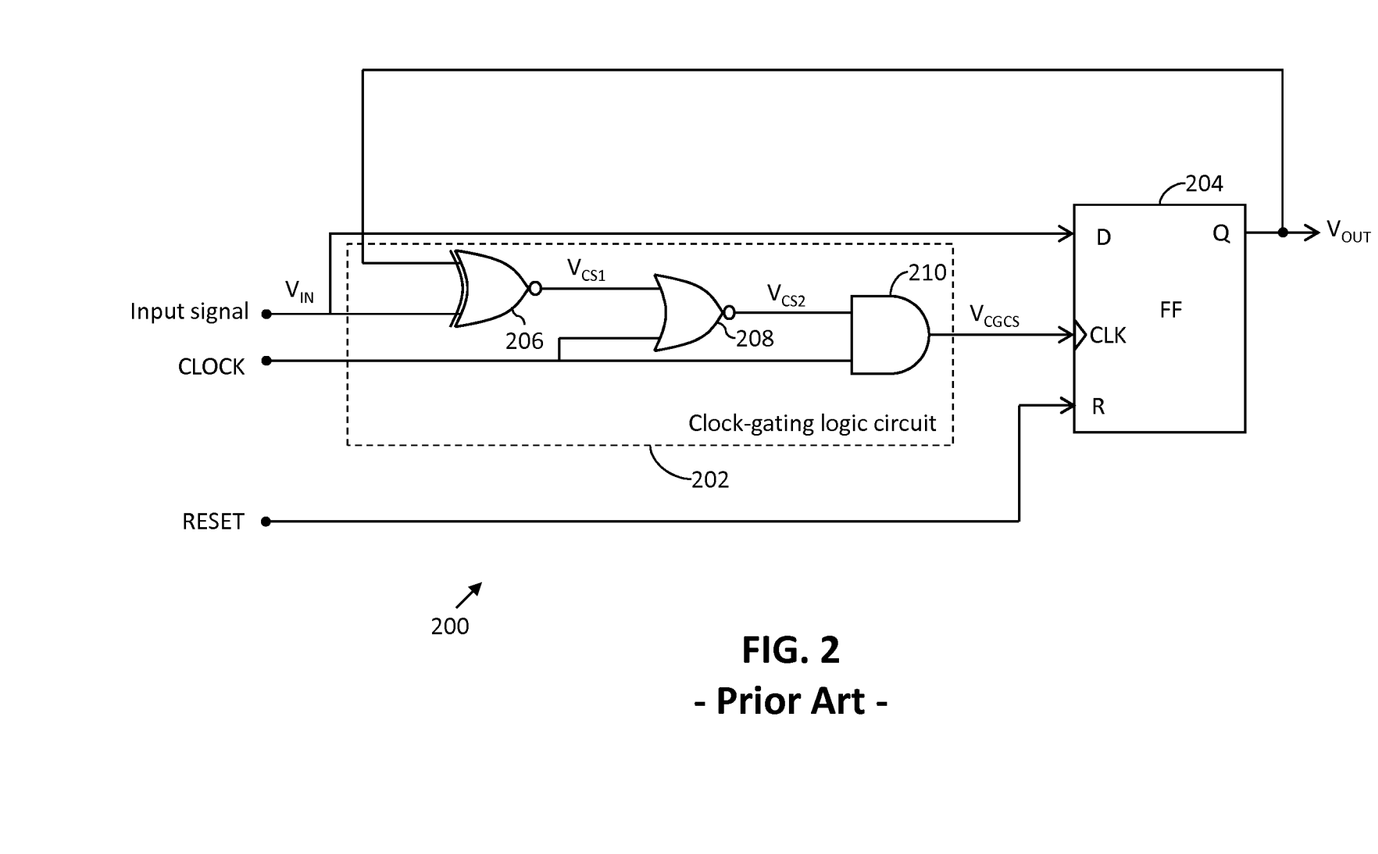
FIG. 2 is a schematic block diagram of a conventional integrated circuit.

One technique to overcome the aforementioned problem is to use a clock-gating logic circuit. FIG. 2 is a schematic block diagram of a conventional integrated circuit (IC) 200 including a clock-gating circuit 202 and a flip-flop 204. The IC 200 receives a test pattern as an input signal ($V_{IN}$), a clock signal and a reset signal. The clock-gating circuit 202 includes an XNOR gate 206, a NOR gate 208, and an AND gate 210.

The XNOR gate 206 has first and second input terminals for receiving an output signal ($V_{OUT}$) and the input signal ($V_{IN}$), respectively, and an output terminal that generates a first control signal ($V_{CS1}$). The NOR gate 208 has a first input terminal connected to the output terminal of the XNOR gate 206 for receiving the first control signal ($V_{CS1}$), a second input terminal for receiving the clock signal, and an output terminal for generating a second control signal ($V_{CS2}$). The AND gate 210 has a first input terminal connected to the output terminal of the NOR gate 208 for receiving the second control signal ($V_{CS2}$), a second input terminal for receiving the clock signal, and an output terminal for generating a clock-gated clock signal ($V_{CGCS}$). The flip-flop 204 has first input terminal for receiving the input signal ($V_{IN}$), a second input terminal for receiving the reset signal, and a clock input terminal connected to the output terminal of the NAND gate 210 for receiving the clock-gated clock signal ($V_{CGCS}$).

In operation, when the logic states of the input signal ($V_{IN}$) and the output signal ($V_{OUT}$) are equal, the first control signal ($V_{CS1}$) and the second control signal ($V_{CS2}$) are at logic high and logic low states, respectively. The clock-gating logic circuit 202 generates the clock-gated clock signal ($V_{CGCS}$) at a logic low state, thereby deactivating the flip-flop 204. However, this technique requires each flip-flop 204 of the scan chain (not shown) to have a clock-gated circuit 202, and hence, leads to a decrease in the number of flip-flops per unit area. Further, the clock-gated circuit 202 increases the propagation delay of the input signal ($V_{IN}$), thereby decreasing the frequency of the clock signal. A decrease in the frequency of the clock signal increases the time required for testing the IC 200.

Figure 3:
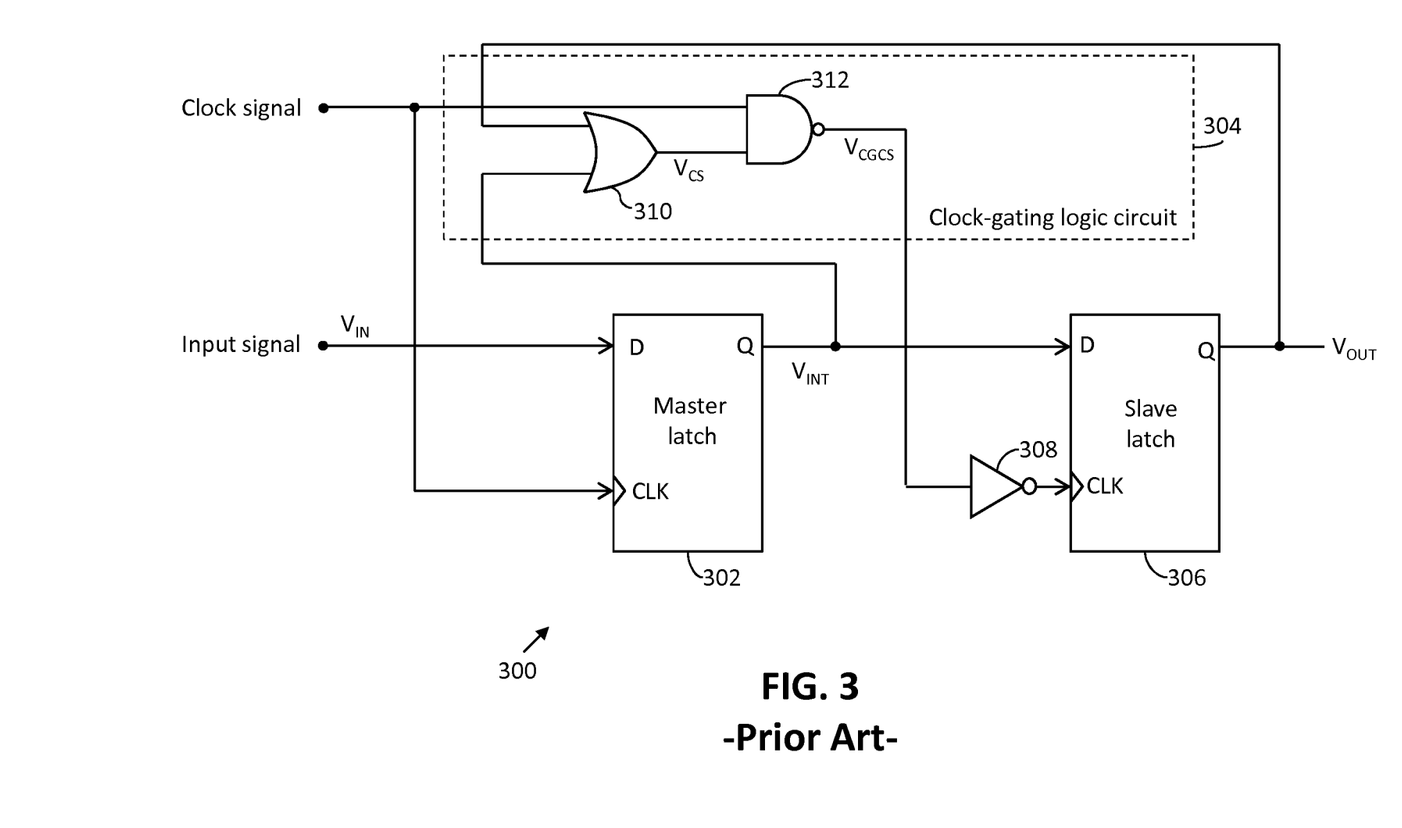
FIG. 3 is a schematic block diagram of a conventional flip-flop circuit.

FIG. 3 is a block diagram of a conventional flip-flop circuit 300 used to overcome the aforementioned problem. The flip-flop circuit 300 includes a master latch 302, a clock-gating circuit 304, a slave latch 306, and a NOT gate 308. The clock-gating circuit 304 includes an OR gate 310 and a NAND gate 312.

The master latch 302 has an input terminal for receiving an input signal ($V_{IN}$) that is a test pattern generated by an ATPG, a clock input terminal for receiving a clock signal, and an output terminal for outputting an intermediate output signal ($V_{INT}$) based on the clock signal. The slave latch 306 has an input terminal connected to the output terminal of the master latch 302 for receiving the intermediate output signal ($V_{INT}$), a clock input terminal for receiving an inverted clock-gated clock signal by way of the NOT gate 308, and an output terminal for outputting an output signal ($V_{OUT}$). The OR gate 310 has a first input terminal connected to the output terminal of the master latch 302 for receiving the intermediate output signal ($V_{INT}$), a second input terminal connected to the output terminal of the slave latch 306 for receiving the output signal ($V_{OUT}$), and an output terminal for generating a control signal ($V_{CS}$). The NAND gate 312 has first input terminal for receiving the clock signal, a second input terminal connected to the output terminal of the OR gate 310 for receiving the control signal ($V_{CS}$), and an output terminal for outputting a clock-gated clock signal ($V_{CGCS}$). The NOT gate 308 has an input terminal connected to the output terminal of the NAND gate 312 for receiving the clock-gated clock signal ($V_{CGCS}$) and an output terminal for outputting the inverted clock-gated clock signal.

In operation, when the logic states of the intermediate output signal ($V_{INT}$) and the output signal ($V_{OUT}$) are low, the control signal ($V_{CS}$ is low. The NAND gate 312 generates the clock-gated clock signal ($V_{CGCS}$) at a logic high state. The NOT gate 308 generates the inverted clock-gated clock signal ($V_{CGCS}$) at a logic low state, thereby deactivating the slave latch 306. However, the master latch 302 is not deactivated. Further, when either the intermediate output signal ($V_{INT}$) or the output signal ($V_{OUT}$) are high, the flip-flop circuit 300 operates as a conventional flip-flop having a master-slave latch configuration. As the master and slave latches 302 and 306 are not deactivated, it results in unnecessary power dissipation. Also, the clock-gating circuit 304 increases the propagation delay of the input signal, thereby decreasing the frequency of the clock signal, which increases test time.

Therefore, it would be advantageous to have a scan flip-flop circuit that prevents charging and discharging of internal components of the scan flip-flop circuit based on the test pattern, reduces power consumption during scan testing of an integrated circuit without increasing circuit area, and does not increase test time.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a scan-testable integrated circuit (IC) is provided. The IC includes first and second flip-flops. The first flip-flop includes first and second latches, and a first multiplexer. The second flip-flop includes a second multiplexer, a first logic circuit, and third and fourth latches. The first multiplexer has a first input terminal for receiving a first data input signal, a second input terminal for receiving a scan data input signal, a select input terminal for receiving a scan enable signal, and an output terminal for outputting at least one of the first data input and scan data input signals based on the scan enable signal. The first latch has an input terminal connected to the output terminal of the first multiplexer for receiving at least one of the first data input and scan data input signals, a clock input terminal for receiving an inverted clock signal, and an output terminal for outputting an intermediate first output signal. The second latch has an input terminal connected to the output terminal of the first latch for receiving the intermediate first output signal, a clock input terminal for receiving a clock signal, and an output terminal for outputting a first output signal. The second multiplexer has a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal. The first logic circuit generates a first intermediate clock signal at an output terminal thereof based on the clock signal, the scan data input signal, the first output signal, and the scan enable signal. The third latch has an input terminal connected to the output terminal of the second multiplexer for receiving at least one of the second data input and first output signals, a clock input terminal connected to the output terminal of the first logic circuit for receiving the first intermediate clock signal, and an output terminal for outputting an intermediate second output signal based on the first intermediate clock signal. The fourth latch having an input terminal connected to the output terminal of the third latch for receiving the intermediate second output signal, a clock input terminal for receiving the clock signal, and an output terminal for outputting a second output signal based on the intermediate second output signal.

In another embodiment of the present invention, a scan-testable integrated circuit (IC) is provided. The IC includes first and second latches, and a first multiplexer. The first multiplexer has a first input terminal for receiving a first data input signal, a second input terminal for receiving a scan data input signal, a select input terminal for receiving a scan enable signal, and an output terminal for outputting at least one of the first data input and scan data input signals based on the scan enable signal. The first latch has an input terminal connected to the output terminal of the first multiplexer for receiving at least one of the first data input and scan data input signals, a clock input terminal for receiving an inverted clock signal, and an output terminal for outputting an intermediate first output signal. The second latch has an input terminal connected to the output terminal of the first latch for receiving the intermediate first output signal, a clock input terminal for receiving a clock signal, and an output terminal for outputting a first output signal. The IC further includes a second multiplexer, a logic circuit, and third and fourth latches. The second multiplexer has a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal. The logic circuit generates an intermediate clock signal at an output terminal thereof based on the clock signal, the scan data input signal, the first output signal, and the scan enable signal. The third latch has an input terminal connected to the output terminal of the second multiplexer for receiving at least one of the second data input and first output signals, a clock input terminal connected to the output terminal of the logic circuit for receiving the intermediate clock signal, and an output terminal for outputting an intermediate second output signal based on the intermediate clock signal. The fourth latch has an input terminal connected to the output terminal of the third latch for receiving the intermediate second output signal, a clock input terminal for receiving the clock signal, and an output terminal for outputting a second output signal based on the intermediate second output signal.

In yet another embodiment of the present invention, a scan flip-flop is provided. The scan flip-flop includes a first multiplexer, a first latch, a second latch, a second multiplexer, an XOR gate, a NOT gate, an OR gate, and a NAND gate, and third and fourth latches. The first multiplexer has a first input terminal for receiving a first data input signal, a second input terminal for receiving a scan data input signal, a select input terminal for receiving a scan enable signal, and an output terminal for outputting at least one of the first data input and scan data input signals based on the scan enable signal. The first latch has an input terminal connected to the output terminal of the first multiplexer for receiving at least one of the first data input and scan data input signals, a clock input terminal for receiving an inverted clock signal, and an output terminal for outputting an intermediate first output signal. The second latch has an input terminal connected to the output terminal of the first latch for receiving the intermediate first output signal, a clock input terminal for receiving a clock signal, and an output terminal for outputting a first output signal. The second multiplexer has a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal. The XOR gate has a first input terminal connected to the output terminal of the second latch for receiving the first output signal, a second input terminal connected to the second input terminal of the first multiplexer for receiving the scan data input signal, and an output terminal for outputting a first control signal. The NOT gate has an input terminal for receiving the scan enable signal and an output terminal for generating an inverted scan enable signal. The OR gate has a first input terminal connected to the output terminal of the XOR gate for receiving the first control signal, a second input terminal connected to the output terminal of the NOT gate for receiving the inverted scan enable signal, and an output terminal for generating a second control signal. The NAND gate has a first input terminal for receiving the clock signal, a second input terminal connected to the output terminal of the OR gate for receiving the second control signal, and an output terminal for generating an intermediate clock signal. The third latch has an input terminal connected to the output terminal of the second multiplexer for receiving at least one of the second data input and first output signals, a clock input terminal connected to the output terminal of the logic circuit for receiving the intermediate clock signal, and an output terminal for outputting an intermediate second output signal based on the intermediate clock signal. The fourth latch has an input terminal connected to the output terminal of the third latch for receiving the intermediate second output signal, a clock input terminal for receiving the clock signal, and an output terminal for outputting a second output signal based on the intermediate second output signal.

Various embodiments of the present invention provide a scan-testable IC. The IC includes first and second flip-flops. The first flip-flop includes first and second latches, and a first multiplexer. The second flip-flop includes a second multiplexer, a first logic circuit, and third and fourth latches. When the IC is in a scan-shift mode, during a first clock cycle of a clock signal, the first latch receives a scan data input signal at a logic state corresponding to a first bit of a test pattern by way of the first multiplexer and outputs the first bit. The second latch receives the first bit and outputs a first output signal at a logic state corresponding to the first bit. During a second clock cycle of the clock signal, the third latch (which is a master latch) receives the first bit by way of the second multiplexer and outputs the first bit. The fourth latch (which is a slave latch) receives the first bit and outputs a second output signal at a logic state corresponding to the first bit.

Further, the first multiplexer receives and outputs a second bit of the test pattern as the scan data input signal. The first logic circuit receives the first output signal corresponding to the first bit, the scan data input signal corresponding to the second bit, the clock signal, and a scan enable signal and outputs a first intermediate clock signal. When the logic states of the scan data input signal and the first output signal are equal, i.e., when the first and second bits are at the same logic states, the first logic circuit generates the first intermediate clock signal at a fixed logic state and hence, is deactivated. Thus, at the end of the second clock cycle, i.e., at the beginning of a third clock cycle, the operation state of the master latch is fixed. Therefore, during the third clock cycle, output terminals of the master and the slave latches are retained at the logic state of the first bit. As a result, the internal components of the master latch are not charged and discharged frequently, thereby reducing unnecessary power consumption based on the test pattern. As the power consumption is reduced, the frequency of the clock signal can be increased, thereby decreasing the testing time of the IC.

Figure 4A:
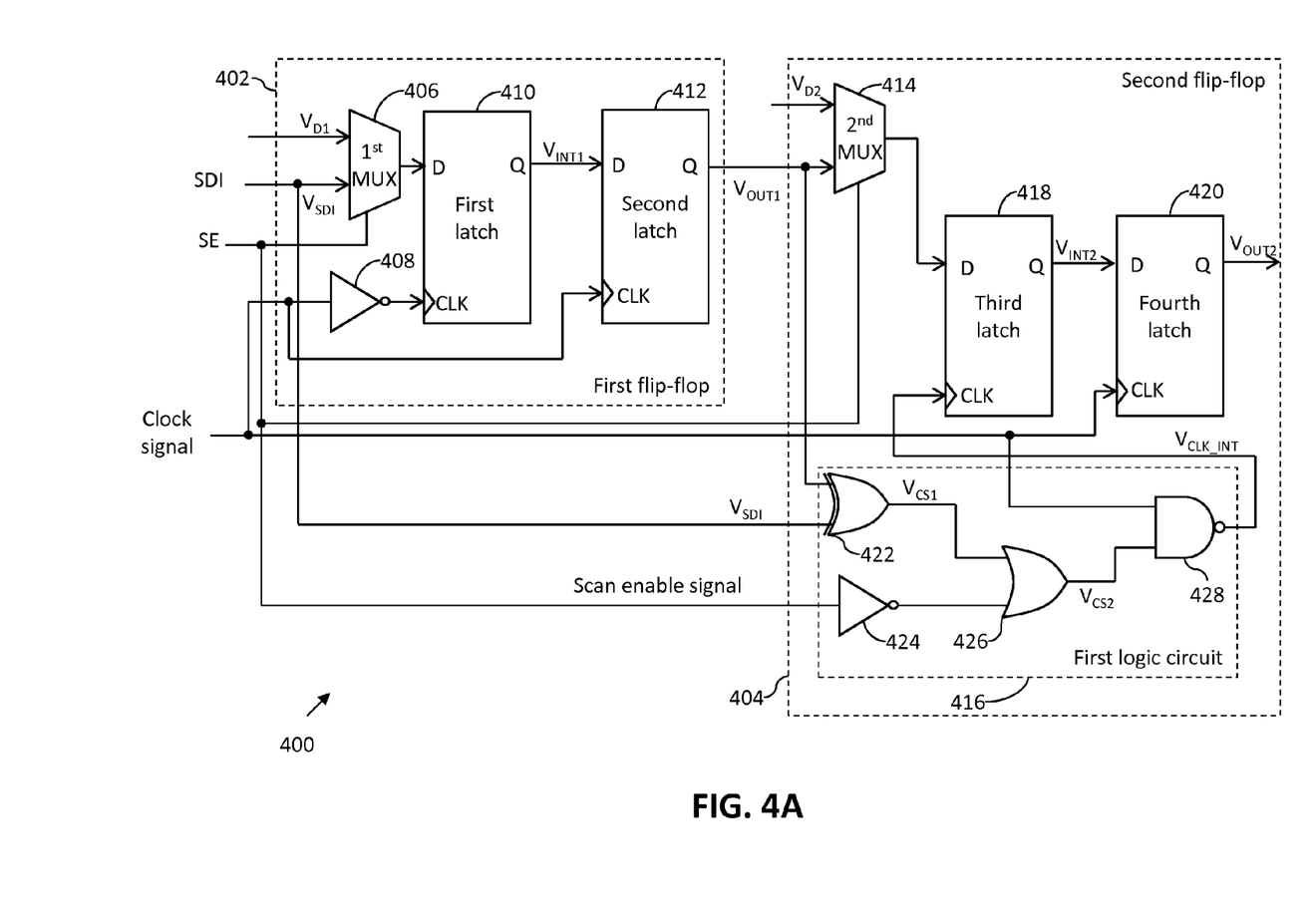
FIG. 4A is a schematic block diagram of an integrated circuit in accordance with an embodiment of the present invention.

Referring to FIG. 4A, a schematic block diagram of a scan-testable integrated circuit (IC) 400 in accordance with an embodiment of the present invention is shown. The IC 400 includes first and second flip-flops 402 and 404.

The first flip-flop 402 includes a first multiplexer 406, a NOT gate 408, and first and second latches 410 and 412. The first and second latches 410 and 412 operate in a master-slave configuration. The first mux 406 has a first input terminal for receiving a first data input signal ($V_{D1}$), a second input terminal for receiving a test pattern as a scan data input signal ($V_{SDI}$), a select input terminal for receiving a scan enable signal, and an output terminal for outputting at least one of the first data input ($V_{D1}$) and scan data input signals ($V_{SDI}$) based on the scan enable signal. In an example, the test pattern is generated by an ATPG (not shown) during scan testing of the IC 400 by an ATE. In another example, the test pattern is generated internally by the IC 400 when built-in-self-test (BIST) is invoked. The first latch 410 has an input terminal connected to the output terminal of the first mux 406 for receiving at least one of the first data input and scan data input signals ($V_{D1}$ and $V_{SDI}$), a clock input terminal for receiving an inverted clock signal by way of the NOT gate 408, and an output terminal for outputting an intermediate first output signal ($V_{INT1}$). The second latch 412 has an input terminal connected to the output terminal of the first latch 410 for receiving the intermediate first output signal ($V_{INT1}$), a clock input terminal for receiving a clock signal, and an output terminal for outputting a first output signal ($V_{OUT1}$).

The second flip-flop 404 includes a second mux 414, a first logic circuit 416, and third and fourth latches 418 and 420. The third and fourth latches 418 and 420 operate in a master-slave configuration. The first logic circuit 416 includes an XOR gate 422, a NOT gate 424, an OR gate 426, and a NAND gate 428. The second mux 414 has a first input terminal for receiving a second data input signal ($V_{D2}$), a second input terminal connected to the output terminal of the second latch 414 for receiving the first output signal ($V_{OUT1}$), a select input terminal for receiving the scan enable signal, and an output terminal for outputting at least one of the second data input and first output signals ($V_{D2}$ and $V_{OUT1}$) based on the scan enable signal. The XOR gate 422 has a first input terminal connected to the output terminal of the second latch 412 for receiving the first output signal ($V_{OUT1}$), a second input terminal connected to the second input terminal of the first mux 406 for receiving the scan data input signal ($V_{SDI}$), and an output terminal for generating a first control signal ($V_{CS1}$). The OR gate 426 has a first input terminal connected to the output terminal of the XOR gate 422 for receiving the first control signal ($V_{CS1}$), a second input terminal for receiving an inverted scan enable signal by way of the NOT gate 424, and an output terminal for generating a second control signal ($V_{CS2}$). The NAND gate 428 has a first input terminal for receiving the clock signal, a second input terminal connected to the output terminal of the OR gate 426 for receiving the second control signal ($V_{CS2}$), and an output terminal for generating a first intermediate clock signal ($V_{CLK\_INT}$). The third latch 418 has an input terminal connected to the output terminal of the second mux 414 for receiving at least one of the second data input and first output signals ($V_{D2}$ and $V_{OUT1}$), a clock input terminal connected to the output terminal of the NAND gate 428 for receiving the first intermediate clock signal ($V_{CLK\_INT}$), and an output terminal for outputting an intermediate second output signal ($V_{INT2}$) based on the first intermediate clock signal ($V_{CLK\_INT}$). The fourth latch 420 has an input terminal connected to the output terminal of the third latch 418 for receiving the intermediate second output signal ($V_{INT2}$), a clock input terminal for receiving the clock signal, and an output terminal for outputting a second output signal ($V_{OUT2}$) based on the intermediate second output signal ($V_{INT2}$).

Figure 4B:
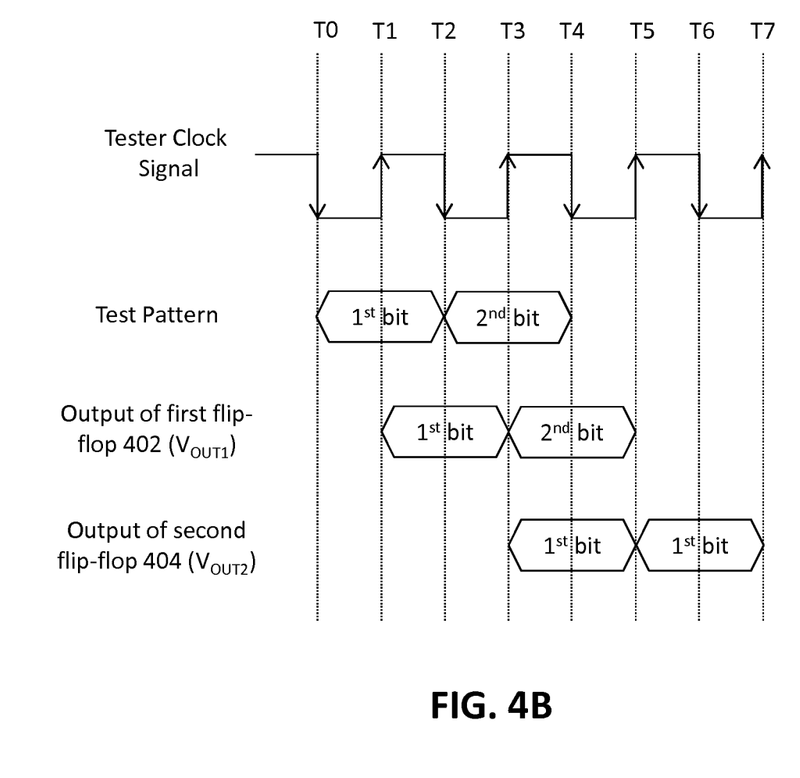
FIG. 4B is a timing diagram illustrating the scan-shift mode operation of the integrated circuit of FIG. 4A in accordance with an embodiment of the present invention.

Referring now to FIG. 4B, a timing diagram illustrating the scan-shift mode of the IC 400 is shown. FIG. 4B illustrates a test pattern having first and second bits. In an embodiment of the present invention, the logic states of the first and second bits are equal. At time instance T0, the scan enable signal is set to a logic high state to initiate scan testing of the IC 400. The first bit of the test pattern is shifted-in to the IC 400. The first mux 406 receives the scan data input signal ($V_{SDI}$) at a logic state corresponding to the first bit. Since the scan enable signal is at a logic high state, the first mux 406 outputs the first bit.

During time period T0-T1, the clock signal is at a logic low state. The first latch 410 receives the scan data input signal ($V_{SDI}$) at a logic state corresponding to the first bit. The first latch 410 receives the clock signal at a logic high state by way of the NOT gate 408, and hence, is activated. Thus, the first latch 410 outputs the intermediate first output signal ($V_{INT1}$) at the logic state corresponding to the first bit. The second latch 412 receives the clock signal at a logic low state and hence, is deactivated.

During time period T1-T2, the clock signal is at a logic high state. The first latch 410 receives the clock at a logic low state by way of the NOT gate 408, and hence is deactivated. Therefore, the output terminal of the first latch 410 is retained at the logic state corresponding to the first bit. The second latch 412 receives the clock signal at a logic high state, and hence is activated. Therefore, the second latch 412 receives the intermediate first output signal ($V_{INT1}$) at the logic state corresponding to the first bit and outputs the first output signal ($V_{OUT1}$) at a logic state corresponding to the first bit.

Thus, during time period T0-T2, the first flip-flop 402 shifts-in the first bit of the test pattern and generates the first output signal ($V_{OUT1}$) at a logic state corresponding to the first bit at the rising edge of the clock signal, i.e., time instance T1.

At time instance T2, a second bit of the test pattern is shifted-in to the IC 400. The first mux 406 receives the scan data input signal ($V_{SDI}$) at a logic state corresponding to the second bit. Since the scan enable signal is at a logic high state, the first mux 406 outputs the second bit.

During time instance T2-T3, the clock signal is at a logic low state. The first latch 410 receives the scan data input signal ($V_{SDI}$) at a logic state corresponding to the second bit. The first latch 410 receives the clock signal at a logic high state by way of the NOT gate 408 and outputs the intermediate first output signal ($V_{INT1}$) at a logic state corresponding to the second bit. The second latch 412 receives the clock signal at a logic low state, and hence is deactivated. Thus, the first output signal ($V_{OUT1}$) is retained at a logic state corresponding to the first bit.

Further, during time period T2-T3, the logic states of the first and the second bits are equal, i.e., the logic states of the first output signal ($V_{OUT1}$) and the scan data input signal ($V_{SDI}$) are equal. Therefore, the first logic circuit 416 generates the first intermediate clock signal ($V_{CLK\_INT}$) at a logic high state, thereby activating the third latch 418. The third latch 418 receives the first output signal ($V_{OUT1}$) by way of the second mux 414 and outputs the intermediate second output signal ($V_{INT2}$) at a logic state corresponding to the first bit. The fourth latch 420 receives the clock signal at a logic low state and hence, is deactivated.

During time period T3-T4, the clock signal is at a logic high state. The first latch 410 receives the clock signal at a logic low state, and hence is deactivated. As the first latch 410 is deactivated, the intermediate first output signal ($V_{INT1}$) is retained at a logic state corresponding to the second bit. The second latch 412 receives the clock signal at a logic high state, and hence is activated. Therefore, the second latch 412 outputs the first output signal ($V_{OUT1}$) at a logic state corresponding to the second bit. The fourth latch 420 receives the clock signal at a logic high state and hence, is activated. The fourth latch 420 receives the intermediate second output signal ($V_{INT2}$) at a logic state corresponding to the first bit and outputs the second output signal ($V_{OUT2}$) at a logic state corresponding to the first bit.

Further, during time period T3-T4, as the logic states of the first and the second bits are equal, the logic states of the first output signal ($V_{OUT1}$) and the scan data input signal ($V_{SDI}$) are equal. Therefore, the first logic circuit 416 retains the first intermediate clock signal ($V_{CLK\_INT}$) at a logic high state. Thus, the logic states of the first intermediate clock signal ($V_{CLK-INT}$) during time periods T2-T3 and T3-T4 are equal, i.e., the first intermediate clock signal ($V_{CLK\_INT}$) does not toggle, and hence the first intermediate clock signal ($V_{CLK\_INT}$) is deactivated. Therefore, the third latch 418 retains the intermediate second output signal ($V_{INT2}$) at a logic state corresponding to the logic state of the first bit.

Thus, during time period T2-T4, the first flip-flop 402 receives the second bit of the test pattern and outputs the first output signal ($V_{OUT1}$) at a logic state corresponding to the second bit at the rising edge of the clock signal, i.e., time instance T3. The second flip-flop outputs the second output signal ($V_{OUT2}$) at a logic state corresponding to the first bit at the rising edge of the clock signal, i.e., time instance T3. Further, since the first intermediate clock signal ($V_{CLK\_INT}$) is deactivated during time period T2-T4, the internal components of the third latch 418 (which is the master latch) are disabled, and hence are not charged and discharged frequently. Thus, the first logic circuit 416 prevents and reduces unnecessary power consumption when logic states of consecutive bits of the test pattern are equal. Further, as the power consumption is reduced, the frequency of the clock signal can be increased, thereby allowing fast shifting of the bits of the test pattern as compared to the conventional ICs and decreasing the testing time of the IC 400.

During time period T4-T5, the clock signal is at a logic low level. The first latch 410 is activated, and hence, receives the scan data input signal ($V_{SDI}$) at a logic state corresponding to a third bit (not shown). The second latch 412 receives the clock signal at a logic low level, and hence is deactivated. Thus, the first output signal ($V_{OUT1}$) is retained at a logic level corresponding to the second bit. The first logic circuit 416 generates the first intermediate clock signal ($V_{CLK\_INT}$) based on the logic states of the second and third bits. The third latch 418 retains the logic state of the intermediate second output signal ($V_{INT2}$) based on the first intermediate clock signal ($V_{CLK\_INT}$). The fourth latch 420 receives the clock signal at a logic low level and hence, is deactivated. Thus, the second output signal ($V_{OUT2}$) is retained at a logic level corresponding to the first bit.

During time period T5-T6, the clock signal is at a logic high level. The fourth latch 420 receives the clock signal at a logic high state and hence, is activated. Thus, the fourth latch 420 outputs the second output signal ($V_{OUT2}$) at a logic state corresponding to the first bit.

Thus, during time period T4-T6, although the first flip-flop 402 shifts-out the second bit to the second flip-flop 404, the second flip-flop 404 retains the second output signal ($V_{OUT2}$) at a logic state corresponding to the first bit during the rising edge of the clock signal, i.e., time instance T5.

Figure 5:
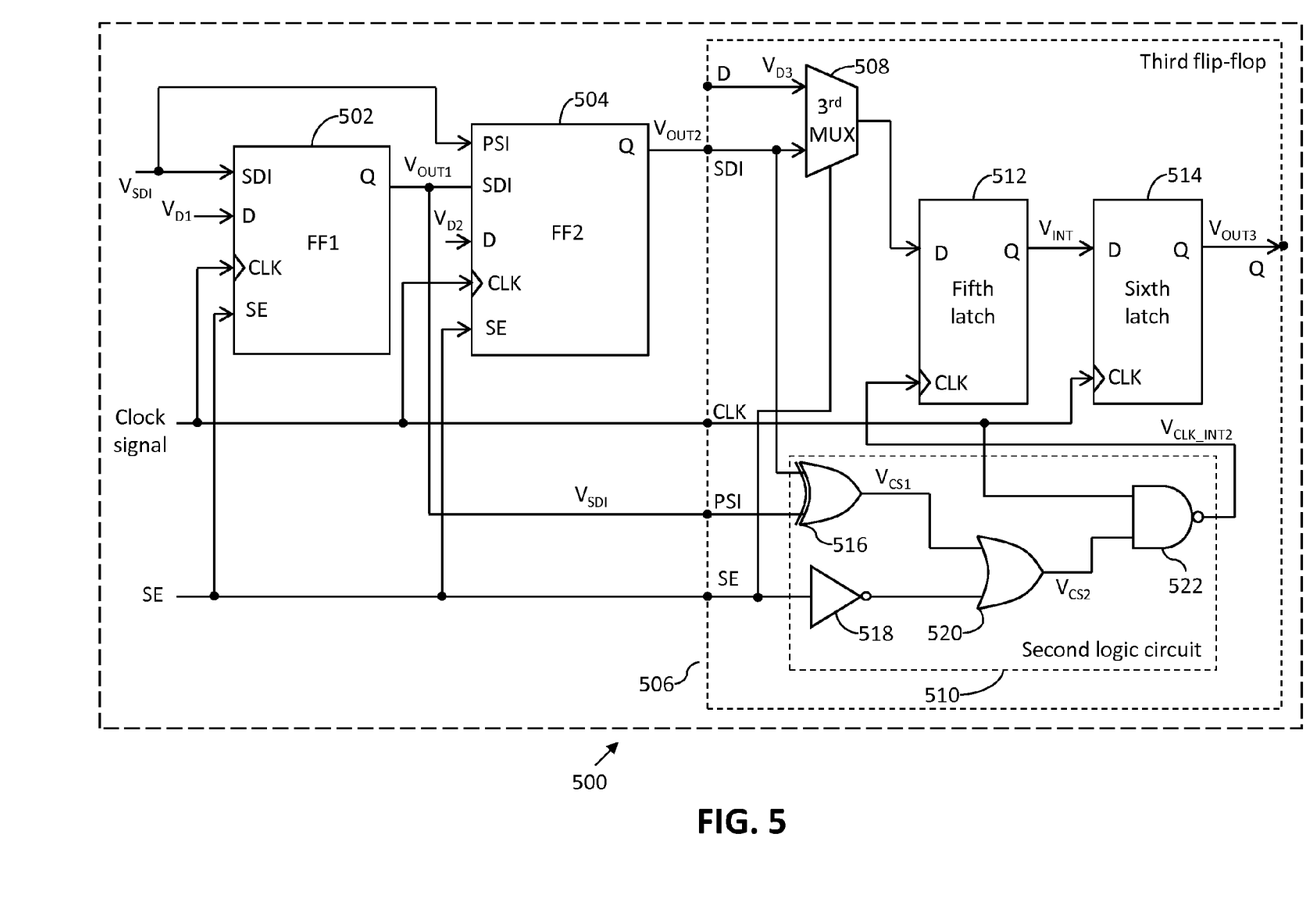
FIG. 5 is a schematic block diagram of an integrated circuit in accordance with another embodiment of the present invention.

Referring to FIG. 5, a scan-testable integrated circuit (IC) 500, in accordance with yet another embodiment of the present invention, is shown. The IC 500 includes a first flip-flop 502, a second flip-flop 504 and a third flip-flop 506.

The first flip-flop 502 has a first input terminal for receiving a scan data input signal ($V_{SDI}$), a second input terminal for receiving a first data input signal ($V_{D1}$), a clock input terminal for receiving a clock signal, a scan enable terminal for receiving a scan enable signal, and an output terminal for outputting a first output signal ($V_{OUT1}$). The first flip-flop 502 is structurally and functionally similar to the first flip-flop 402 of FIG. 4A and includes the first multiplexer 406, the NOT gate 408, and the first and second latches 410 and 412.

The second flip-flop 504 has a first input terminal connected to the first input terminal of the first flip-flop 502 for receiving the scan data input signal ($V_{SDI}$), a second input terminal connected to the output terminal of the first flip-flop 502 for receiving the first output signal ($V_{OUT1}$), a third input terminal for receiving a second data input signal ($V_{D2}$), a clock input terminal for receiving the clock signal, a scan enable terminal for receiving the scan enable signal, and an output terminal for outputting a second output signal ($V_{OUT2}$). The second flip-flop 504 is structurally and functionally similar to the second flip-flop 404 of FIG. 4A. The second flip-flop 504 includes the second mux 414, the first logic circuit 416, and the third and fourth latches 418 and 420.

The third flip-flop 506 is structurally and functionally similar to the second flip-flop 404 of FIG. 4A. The third flip-flop 506 includes a third mux 508, a second logic circuit 510, fifth and sixth latches 512 and 514. The fifth and sixth latches 512 and 514 operate in a master-slave configuration. The fifth latch 512 is the master latch of the third flip-flop 506 and the sixth latch 514 is the slave latch of the third flip-flop 506. The second logic circuit 510 includes an XOR gate 516, a NOT gate 518, an OR gate 520, and a NAND gate 522. The third flip-flop 506 has a first input terminal connected to the second input terminal of the second flip-flop 504 for receiving the first output signal ($V_{OUT1}$), a second input terminal connected to the output terminal of the second flip-flop 504 for receiving the second output signal ($V_{OUT2}$), a third input terminal for receiving a third data input signal ($V_{D3}$), a clock input terminal for receiving the clock signal, a scan enable terminal for receiving the scan enable signal, and an output terminal for outputting a third output signal ($V_{OUT3}$).

In operation, when the IC 500 is subjected to scan testing, the scan enable signal is at a logic high state. When the logic states of the scan data input signal ($V_{SDI}$) and the first output signal ($V_{OUT1}$) are equal, the first intermediate clock signal ($V_{CLK\_INT1}$) received by the third latch 418 is deactivated. Similarly, when the logic states of the first output signal ($V_{OUT1}$) and the second output signal ($V_{OUT2}$) are equal, a second intermediate clock signal ($V_{CLK\_INT2}$) received by the fifth latch 512 is deactivated. Thus, when the logic states of consecutive bits of the test pattern are equal, the second and third flip-flops 504 and 506 retain the logic states of the second and third output signals ($V_{OUT2}$ and $V_{OUT3}$), respectively, thereby reducing power consumption of the IC 500 during scan testing.

In an embodiment of the present invention, the first and second flip-flops 402 and 404 are positive-edge triggered D-type flip-flops. In another embodiment of the present invention, the first, second and third flip-flops 502, 504, and 506 are positive-edge triggered D-type flip-flops. In an embodiment of the present invention, the first, second, third, fourth, fifth and sixth latches 410, 412, 418, 420, 512, and 514 are D-type latches.

In yet another embodiment of the present invention, the IC 400 is also referred to as a scan flip-flop circuit 400. Multiple scan flip-flop circuits 400 are connected to construct a scan chain (not shown). An IC (not shown) that includes the scan chain having the scan flip-flop circuits 400 can be successfully subjected to scan testing, thereby reducing power consumption of the IC when logic states of consecutive bits of a test pattern are equal.

It will be further understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit, comprising:
a first flip-flop including:
a first multiplexer having a first input terminal for receiving a first data input signal, a second input terminal for receiving a scan data input signal, a select input terminal for receiving a scan enable signal, and an output terminal for outputting at least one of the first data input and scan data input signals based on the scan enable signal;
a first latch having an input terminal connected to the output terminal of the first multiplexer for receiving at least one of the first data input and scan data input signals, a clock input terminal for receiving an inverted clock signal, and an output terminal for outputting an intermediate first output signal; and
a second latch having an input terminal connected to the output terminal of the first latch for receiving the intermediate first output signal, a clock input terminal for receiving a clock signal, and an output terminal for outputting a first output signal; and a second flip-flop including:
a second multiplexer having a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal;
a first logic circuit for generating a first intermediate clock signal at an output terminal thereof based on the clock signal, the scan data input signal, the first output signal, and the scan enable signal;
a third latch having an input terminal connected to the output terminal of the second multiplexer for receiving at least one of the second data input and first output signals, a clock input terminal connected to the output terminal of the first logic circuit for receiving the first intermediate clock signal, and an output terminal for outputting an intermediate second output signal based on the first intermediate clock signal; and
a fourth latch having an input terminal connected to the output terminal of the third latch for receiving the intermediate second output signal, a clock input terminal for receiving the clock signal, and an output terminal for outputting a second output signal, wherein the fourth latch outputs the second output signal based on the intermediate second output signal.

2. The integrated circuit of claim 1, wherein the first logic circuit deactivates the first intermediate clock signal when the logic state of the first output signal is equal to the logic state of the scan data input signal.

3. The integrated circuit of claim 2, wherein the third latch is disabled when the first intermediate clock signal is deactivated.

4. The integrated circuit of claim 3, wherein the fourth latch retains the logic state of the second output signal when the third latch is disabled.

5. The integrated circuit of claim 1, wherein the first logic circuit comprises:
an XOR gate having a first input terminal connected to the output terminal of the second latch for receiving the first output signal, a second input terminal connected to the second input terminal of the first multiplexer for receiving the scan data input signal, and an output terminal for outputting a first control signal;
a NOT gate having an input terminal for receiving the scan enable signal and an output terminal for generating an inverted scan enable signal;
an OR gate having a first input terminal connected to the output terminal of the XOR gate for receiving the first control signal, a second input terminal connected to the output terminal of the NOT gate for receiving the inverted scan enable signal, and an output terminal for generating a second control signal; and
a NAND gate having a first input terminal for receiving the clock signal, a second input terminal connected to the output terminal of the OR gate for receiving the second control signal, and an output terminal for generating the first intermediate clock signal.

6. The integrated circuit of claim 1, further comprising a third flip-flop, including:
a third multiplexer having a first input terminal for receiving a third data input signal, a second input terminal connected to the output terminal of the fourth latch for receiving the second output signal, a select input terminal for receiving the scan enable signal, and an output terminal for outputting at least one of the third data input and second output signals based on the scan enable signal;

a second logic circuit for generating a second intermediate clock signal at an output terminal thereof based on the clock signal, the first output signal, the second output signal, and the scan enable signal;

a fifth latch having an input terminal connected to the output terminal of the third multiplexer for receiving at least one of the third data input and second output signals, a clock input terminal connected to the output terminal of the second logic circuit for receiving the second intermediate clock signal, and an output terminal for outputting an intermediate third output signal based on the second intermediate clock signal; and a sixth latch having an input terminal connected to the output terminal of the fifth latch for receiving the intermediate third output signal, a clock input terminal for receiving the clock signal, and an output terminal for outputting a third output signal, wherein the sixth latch outputs the third output signal based on the intermediate third output signal.

7. The integrated circuit of claim 6, wherein the sixth latch retains the logic state of the third output signal when the logic state of the first output signal is equal to the logic state of the second output signal.

8. The integrated circuit of claim 6, wherein the first, second and third flip-flops are positive-edge triggered D-type flip-flops.

9. The integrated circuit of claim 6, wherein the first, second, third, fourth, fifth and sixth latches are D-type latches.

10. An integrated circuit, comprising:

a first multiplexer having a first input terminal for receiving a first data input signal, a second input terminal for receiving a scan data input signal, a select input terminal for receiving a scan enable signal, and an output terminal for outputting at least one of the first data input and scan data input signals based on the scan enable signal;

a first latch having an input terminal connected to the output terminal of the first multiplexer for receiving at least one of the first data input and scan data input signals, a clock input terminal for receiving an inverted clock signal, and an output terminal for outputting an intermediate first output signal;

a second latch having an input terminal connected to the output terminal of the first latch for receiving the intermediate first output signal, a clock input terminal for receiving a clock signal, and an output terminal for outputting a first output signal;

a second multiplexer having a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal;

a logic circuit for generating an intermediate clock signal at an output terminal thereof based on the clock signal, the scan data input signal, the first output signal, and the scan enable signal;

a third latch having an input terminal connected to the output terminal of the second multiplexer for receiving at least one of the second data input and first output signals, a clock input terminal connected to the output terminal of the logic circuit for receiving the intermediate clock signal, and an output terminal for outputting an intermediate second output signal based on the intermediate clock signal; and a fourth latch having an input terminal connected to the output terminal of the third latch for receiving the intermediate second output signal, a clock input terminal for receiving the clock signal, and an output terminal for outputting a second output signal, wherein the fourth latch outputs the second output signal based on the intermediate second output signal.

11. The integrated circuit of claim 10, wherein the logic circuit deactivates the intermediate clock signal when the logic state of the first output signal is equal to the logic state of the scan data input signal.

12. The integrated circuit of claim 11, wherein the third latch is disabled when the intermediate clock signal is deactivated.

13. The integrated circuit of claim 12, wherein the fourth latch retains the logic state of the second output signal when the third latch is disabled.

14. The integrated circuit of claim 10, wherein the logic circuit comprises:

an XOR gate having a first input terminal connected to the output terminal of the second latch for receiving the first output signal, a second input terminal connected to the second input terminal of the first multiplexer for receiving the scan data input signal, and an output terminal for outputting a first control signal;

a NOT gate having an input terminal for receiving the scan enable signal and an output terminal for generating an inverted scan enable signal;

an OR gate having a first input terminal connected to the output terminal of the XOR gate for receiving the first control signal, a second input terminal connected to the output terminal of the NOT gate for receiving the inverted scan enable signal, and an output terminal for generating a second control signal; and a NAND gate having a first input terminal for receiving the clock signal, a second input terminal connected to the output terminal of the OR gate for receiving the second control signal, and an output terminal for generating the intermediate clock signal.

15. The integrated circuit of claim 10, wherein the first, second, third and fourth latches are D-type latches.

16. A scan flip-flop, comprising:

a first multiplexer having a first input terminal for receiving a first data input signal, a second input terminal for receiving a scan data input signal, a select input terminal for receiving a scan enable signal, and an output terminal for outputting at least one of the first data input and scan data input signals based on the scan enable signal;

a first latch having an input terminal connected to the output terminal of the first multiplexer for receiving at least one of the first data input and scan data input signals, a clock input terminal for receiving an inverted clock signal, and an output terminal for outputting an intermediate first output signal;

a second latch having an input terminal connected to the output terminal of the first latch for receiving the intermediate first output signal, a clock input terminal for receiving a clock signal, and an output terminal for outputting a first output signal;

an XOR gate having a first input terminal connected to the output terminal of the second latch for receiving the first output signal, a second input terminal connected to the second input terminal of the first multiplexer for receiving the scan data input signal, and an output terminal for outputting a first control signal;

a NOT gate having an input terminal for receiving the scan enable signal and an output terminal for generating an inverted scan enable signal;

an OR gate having a first input terminal connected to the output terminal of the XOR gate for receiving the first control signal, a second input terminal connected to the output terminal of the NOT gate for receiving the inverted scan enable signal, and an output terminal for generating a second control signal;

a NAND gate having a first input terminal for receiving the clock signal, a second input terminal connected to the output terminal of the OR gate for receiving the second control signal, and an output terminal for generating an intermediate clock signal;

a second multiplexer having a first input terminal for receiving a second data input signal, a second input terminal connected to the output terminal of the second latch for receiving the first output signal, a select input terminal for receiving the scan enable signal, and an output terminal for outputting at least one of the second data input and first output signals based on the scan enable signal;

a third latch having an input terminal connected to the output terminal of the second multiplexer for receiving at least one of the second data input and first output signals, a clock input terminal connected to the output terminal of the logic circuit for receiving the intermediate clock signal, and an output terminal for outputting an intermediate second output signal based on the intermediate clock signal; and a fourth latch having an input terminal connected to the output terminal of the third latch for receiving the intermediate second output signal, a clock input terminal for receiving the clock signal, and an output terminal for outputting a second output signal, wherein the fourth latch outputs the second output signal based on the intermediate second output signal.

17. The scan flip-flop of claim 16, wherein the logic circuit deactivates the intermediate clock signal when the logic state of the first output signal is equal to the logic state of the scan data input signal.

18. The scan flip-flop of claim 17, wherein the third latch is disabled when the intermediate clock signal is deactivated.

19. The scan flip-flop of claim 18, wherein the fourth latch retains the logic state of the second output signal when the third latch is disabled.

20. The scan flip-flop of claim 16, wherein the first, second, third and fourth latches are D-type latches.

\* \* \* \* \*